US010388556B2

(12) United States Patent
Morita et al.

(10) Patent No.: US 10,388,556 B2
(45) Date of Patent: Aug. 20, 2019

(54) BASE FOR BACK GRIND TAPES, AND BACK GRIND TAPE

(71) Applicant: LINTEC CORPORATION, Itabashi-ku (JP)

(72) Inventors: Yuki Morita, Munich (DE); Yosuke Saito, Yoshioka-machi (JP); Shigeto Okuji, Koshigaya (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 15/302,419

(22) PCT Filed: Apr. 10, 2015

(86) PCT No.: PCT/JP2015/061225
§ 371 (c)(1),
(2) Date: Oct. 6, 2016

(87) PCT Pub. No.: WO2015/156389
PCT Pub. Date: Oct. 15, 2015

(65) Prior Publication Data
US 2017/0025303 A1    Jan. 26, 2017

(30) Foreign Application Priority Data

Apr. 11, 2014 (JP) .................................. 2014-082213

(51) Int. Cl.
*H01L 21/683* (2006.01)
*B32B 27/30* (2006.01)
*B32B 27/40* (2006.01)
*C09J 7/29* (2018.01)

(52) U.S. Cl.
CPC ........ *H01L 21/6836* (2013.01); *B32B 27/308* (2013.01); *B32B 27/40* (2013.01); *C09J 7/29* (2018.01); *B32B 2307/54* (2013.01); *B32B 2457/14* (2013.01); *C09J 2201/622* (2013.01); *C09J 2203/326* (2013.01); *C09J 2433/00* (2013.01); *C09J 2475/00* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC ........... B32B 2307/54; B32B 2457/14; B32B 27/308; B32B 27/40; C09J 2001/622; C09J 2203/326; C09J 2433/00; C09J 2475/00; H01L 21/6836; H01L 2221/68318; H01L 2221/68327; H01L 2221/6834; H01L 2221/68381
USPC ................. 257/783; 428/355 RA, 343, 423.1
See application file for complete search history.

(56) References Cited

U.S. PATENT DOCUMENTS 6,524,701 B1 * 2/2003 Kondo .................... B32B 27/36
427/208
2005/0269717 A1   12/2005 Ohashi et al.
2007/0172649 A1   7/2007 Aihara et al.
2014/0079947 A1 * 3/2014 Tamura ............... H01L 21/6836
428/354

FOREIGN PATENT DOCUMENTS

| CN | 102149779 A | 8/2011 |
| JP | 6-85055 A | 3/1994 |
| JP | 2003-92273 A | 3/2003 |
| JP | 2003-147300 A | 5/2003 |
| JP | 2005-343997 A | 12/2005 |

OTHER PUBLICATIONS

International Search Report dated Jun. 23, 2015 in PCT/JP15/061225 Filed Apr. 10, 2015.
Combined Chinese Office Action and Search Report dated May 2, 2018 in Patent Application No. 201580018730.7 (with English language translation of categories of cited documents).

* cited by examiner

*Primary Examiner* — Thao T Tran
(74) *Attorney, Agent, or Firm* — Oblon, McClelland, Maier & Neustadt, L.L.P.

(57) ABSTRACT

A substrate for back grind tape of the present invention includes a substrate film having a Young's modulus of 600 MPa or more; and a buffer layer provided on one face of the substrate film, the buffer layer formed of a urethane-containing cured material and having a peak temperature of tan δ of 60° C. or lower.

6 Claims, No Drawings

BASE FOR BACK GRIND TAPES, AND BACK GRIND TAPE

TECHNICAL FIELD

The present invention relates to a back grind tape which in grinding a back face of a semiconductor wafer, is stuck onto a front face of the wafer for protecting a circuit, and a substrate thereof. In particular, the present invention relates to a back grind tape to be used for a dicing before grinding method, and a substrate thereof.

BACKGROUND ART

In a semiconductor wafer, it is general that after mounting a circuit on its front face, in order to adjust a thickness of the wafer, the wafer back face side is subjected to grinding processing. In grinding processing of the wafer back face, a pressure sensitive adhesive sheet for protecting the circuit, which is called a back grind tape, is stuck onto the front face of the wafer.

In addition, in recent years, a semiconductor chip is sometimes produced by a so-called dicing before grinding method, in which after grooving is performed by means of dicing from the wafer front face side, the wafer back face side is ground until reaching the groove, whereby the wafer is singulated into chips (see, for example, PTL 1). According to the dicing before grinding method, it is possible to obtain an extremely thin semiconductor chip. However, the chip becomes brittle, and when the wafer is singulated into chips a breakage is generated in the four corners, etc. of the semiconductor chip, and a problem of so-called kerf shift in which chips minutely move, whereby the alignment of chips is disordered is caused.

As a back grind tape for dicing before grinding, there has hitherto been known one composed of a rigid substrate, a buffer layer provided on one face of the rigid substrate, and a pressure sensitive adhesive layer provided on the other face of the rigid substrate. In this back grind tape, by regulating a Young's modulus of the rigid substrate to 1,000 MPa or more and also regulating a maximum value of tan δ of the buffer layer to 0.5 or more, not only the chip alignment after dividing the wafer is made favorable, but also a breakage and the like as generated in the singulated semiconductor chips are reduced (see, for example, PTL 2).

CITATION LIST

Patent Literature

PTL 1: JP 6-85055 A
PTL 2: JP 2005-343997 A

SUMMARY OF INVENTION

Technical Problem

It is general that the wafer having a back grind tape stuck thereonto is disposed so that the buffer layer side comes into contact with a porous table, and then is ground while it is fixed to the porous table by a negative pressure.

However, when the back grind tape having a substrate with high rigidity as in PTL 2 is used, there is a case where the semiconductor wafer causes flapping, etc. at the time of grinding, and a fine breakage is generated in its edge, thereby generating wafer cracking. The breakage of the wafer edge generated at the time of the grinding cannot be thoroughly prevented just by increasing the maximum value of tan δ as in PTL 2.

In view of the foregoing problem, the present invention has been made. A problem of the present invention is to inhibit the generation of a fine breakage in a wafer edge part at the time of wafer grinding even in the case where a back grind tape has a substrate with high rigidity.

Solution To Problem

In order to solve the foregoing problem, the present inventors made extensive and intensive investigations. As a result, it has been found that in the case of using a substrate with high rigidity for a back grind tape, in order to prevent a wafer breakage generated at the time of grinding, it is necessary to make a peak temperature of tan δ of a buffer layer low, leading to accomplishment of the present invention.

Specifically, the present invention provides the following (1) to (3).
(1) A substrate for back grind tape, including a substrate film having a Young's modulus of 600 MPa or more; and a buffer layer provided on one face of the substrate film, the buffer layer being formed of a urethane-containing cured material and having a peak temperature of tan δ of 60° C. or lower.
(2) The substrate for back grind tape as set forth above in (1), wherein the urethane-containing cured material is a cured product of a resin composition containing a urethane acrylate oligomer and an energy ray-polymerizable monomer, and the energy ray-polymerizable monomer includes a (meth)acrylate having an aromatic structure.
(3) A back grind tape including the substrate for back grind tape as set forth above in (1) or (2); and a pressure sensitive adhesive layer provided on a face of the substrate film opposite to the face on which the buffer layer is provided.

Advantageous Effects of Invention

In accordance with the present invention, even in the case where a substrate with high rigidity is used for a back grind tape, the generation of a fine breakage in a wafer edge part at the time of wafer grinding can be inhibited.

DESCRIPTION OF EMBODIMENTS

The present invention is hereunder described in detail with reference to embodiments.

It is to be noted that in the present specification, the "(meth)acryloyl" is used as a term meaning either one of "acryloyl" or "methacryloyl" or both of them. In addition, the "(meth)acrylate" is used as a term meaning either one of "acrylate" or "methacrylate" or both of them.

The substrate for back grind tape of the present invention includes a substrate film and a buffer layer provided on one face of the substrate film.

In addition, the back grind tape of the present invention includes the aforementioned substrate for back grind tape and a pressure sensitive adhesive layer laminated on a face of the substrate film opposite to the face on which the buffer layer is provided. The back grind tape of the present invention is stuck onto a front face of a semiconductor wafer through the pressure sensitive adhesive layer, and protects a circuit or the others provided on the front face of the semiconductor wafer when a back face of the semiconductor wafer is ground.

Respective members of the substrate for back grind tape and the back grind tape in the present invention are hereunder described in detail.

[Substrate Film]

The substrate film of the present invention has a Young's modulus of 600 MPa or more. In the present invention, if the Young's modulus of the substrate film is less than 600 MPa, the rigidity of the substrate would become low, and a supporting performance of the substrate to the wafer would be decreased. In consequence, positional displacement of the chips might occur, thereby causing a problem in chip alignment, for example, when the wafer is singulated into chips at the time grinding in case of a dicing before grinding method. In addition, even when the dicing before grinding method is not performed, in view of the fact that the Young's modulus of the substrate film is 600 MPa or more, there is brought such an advantage that wafer warpage to be caused due to a residual stress in the wafer can be inhibited.

The Young's modulus of the substrate film is preferably 600 to 30,000 MPa, and more preferably 1,000 to 10,000 MPa. By regulating the Young's modulus to such an upper limit value or less, in releasing the back grind tape, the stress acting on the wafer or chip can be made small. In addition, by regulating the Young's modulus to 1,000 MPa or more, the supporting performance of the substrate film is improved, and when used for the dicing before grinding method, the positional displacement of the chips can be more reduced.

Examples of the substrate film include resin films composed of polyethylene terephthalate, polyethylene naphthalate, polybutylene terephthalate, polyamide, polyacetal, polycarbonate, modified polyphenylene oxide, polyphenylene sulfide, polysulfone, wholly aromatic polyester, polyetherketone, polyimide, polypropylene, or the like. Of those, polyester films such as polyethylene terephthalate, polyethylene naphthalate, polybutylene terephthalate, and the like are preferred, and a polyethylene terephthalate film is especially preferred. The substrate film may be any of a non-stretched film, a uniaxially stretched film, and a biaxially stretched film. In addition, the substrate film may be of a single-layer structure or may be of plural layers, formed upon being properly selected among the aforementioned materials, or the like.

A thickness of the substrate film is, for example, 10 to 150 μm, and preferably 25 to 130 μm. In the present invention, by regulating the thickness to such a range, the supporting performance of the substrate film can be made more favorable.

[Buffer Layer]

The buffer layer of the present invention is formed of a urethane-containing cured material and has a peak temperature of tan δ of 60° C. or lower.

As described later, the wafer having a back grind tape stuck thereonto is typically fixed to a porous table by a negative pressure. On that occasion, the buffer layer to be disposed in an outermost layer of the back grind tape serves as a layer coming into contact with the porous table. In view of the fact that the buffer layer of the present invention is formed of a urethane-containing cured material, the buffer layer is relatively low in rigidity and readily follows the porous table, and therefore, it becomes possible to be fixed to the porous table more firmly as compared with the case where the substrate film with high rigidity of the present invention is directly fixed.

In addition, when grinding is commenced on the semiconductor wafer fixed to the porous table through the back grind tape of the present invention, the temperature of the semiconductor wafer gradually rises. Here, when the peak temperature of tan δ of the buffer layer is 60° C. or lower as in the present invention, it is conjectured that followability of the buffer layer to the porous table is exhibited in a relatively early stage after commencement of grinding, whereby the generation of a residual stress can be inhibited, and a breakage of the wafer edge is inhibited. In particular, in the case of using a support film with high rigidity as in the present invention, the followability to the porous table at the time of temperature rise tend to be deteriorated; however, by providing the buffer layer having a peak temperature of tan δ of 60° C. or lower, the followability can be made favorable.

In order to make the followability of the buffer layer to the porous table more favorable and reduce a breakage of the wafer edge, the peak temperature of tan δ is regulated to preferably 57° C. or lower, and more preferably 45° C. or lower. In addition, the peak temperature of tan δ is typically 20° C. or higher, and preferably 30° C. or higher.

In addition, a peak value of the aforementioned tan δ is preferably 0.5 or more. When the peak value is 0.5 or more, since an impact is readily absorbed by the buffer layer, a breakage of the wafer edge or a breakage generated in chips singulated by the dicing before grinding method is readily inhibited. In addition, from the viewpoint that the breakage or the like of the wafer edge can be inhibited, the peak value of tan δ is more preferably 0.7 or more, and especially preferably 0.85 or more.

In addition, the peak value of tan bis typically 1.5 or less, and preferably 1.15 or less, though it is not particularly limited to these.

The tan δ is called a loss tangent and defined by (loss modulus)/(storage modulus). Specifically, the tan δ is measured using a dynamic viscoelasticity measuring instrument by a measurement method as described later.

In addition, a thickness of the buffer layer is, for example, 5 to 100 μm, and preferably 15 to 80 μm.

The urethane-containing cured material that forms the buffer layer of the present invention is a cured product of a resin composition, such as an energy ray-curable type resin composition, and a thermosetting type resin composition, and an energy ray-curable type resin composition is preferably used. In addition, as the energy ray-curable type resin composition, one containing, as a base agent, an energy ray-polymerizable urethane acylate oligomer is preferably used.

The urethane acrylate oligomer is a compound having a (meth)acryloyl group and a urethane bond and is, for example, one obtained by allowing an isocyanate-terminated urethane prepolymer which is obtained through a reaction between a polyol compound and a polyvalent isocyanate compound, to react with a hydroxyl group-containing (meth)acrylate or the like.

The urethane acrylate oligomer of the present invention is preferably a polyether-based urethane acrylate oligomer or a polyester-based urethane acrylate oligomer in which the aforementioned polyol compound is a polyether polyol or a polyester polyol, and more preferably a polyether-based urethane acrylate oligomer.

Examples of the polyvalent isocyanate compound include 2,4-tolylene diisocyanate, 2,6-tolylene diisocyanate, 1,3-xylylene diisocyanate, 1,4-xylylene diisocyanate, diphenylmethane 4,4-diisocyanate, and the like. In addition, examples of the hydroxyl group-containing (meth)acrylate include 2-hydroxyethyl (meth)acrylate, 2-hydroxypropyl (meth)acrylate, polyethylene glycol (meth)acrylate, and the like.

Such a urethane acrylate oligomer has an energy ray-polymerizable double bond in a molecule thereof and undergoes polymerization and curing upon irradiation with energy rays, such as ultraviolet rays, etc., to form a film.

A weight average molecular weight of the urethane acrylate oligomer that is preferably used in the present invention is in the range of preferably from 1,000 to 50,000, and more preferably from 2,000 to 30,000. When the weight average molecular weight falls within the foregoing range, it is easy to regulate the peak temperature of tan δ to 60° C. or lower, and the elastic modulus and film forming properties of the buffer layer can be made appropriate.

In the present specification, the weight average molecular weight is a value as converted into standard polystyrene, which is measured by the gel permeation chromatography (GPC) method.

The urethane acrylate oligomer can be used either solely or in combination of two or more thereof.

It is preferred that the resin composition for forming the buffer layer further contains an energy ray-polymerizable monomer. In the resin composition, when only the urethane acrylate oligomer is contained, it is often difficult to undergo the film formation. However, when the resin composition is diluted with the energy ray-polymerizable monomer, the film forming properties are readily made favorable. Examples of the energy ray-polymerizable monomer include monomers having an energy ray-polymerizable double bond in a molecule thereof and having a relatively bulky group.

Specifically, examples of such an energy ray-polymerizable monomer include (meth)acrylates having a polycyclic alicyclic structure (e.g., a bicyclic structure, a tricyclic structure, etc.), such as isobornyl (meth)acrylate, dicyclopentenyl (meth)acrylate, dicyclopentenyloxy (meth)acrylate, dicyclopentanyl (meth)acrylate, adamantane (meth)acrylate, etc.; (meth)acrylates having a monocyclic alicyclic structure, such as cyclohexyl (meth)acrylate, etc.; (meth)acrylates having an aromatic structure, such as benzyl (meth)acrylate, phenylhydroxypropyl (meth)acrylate, etc.; (meth)acrylates having a heterocyclic structure, such as tetrahydrofurfuryl (meth)acrylate, morpholine (meth)acrylate, etc.; vinyl monomers other than (meth)acrylates and having a heterocyclic structure, such as N-vinylpyrrolidone, N-vinylcaprolactam, etc.; and the like. Of those, a variety of (meth)acrylates are preferred. In addition, the energy ray-polymerizable monomer is not restricted to those described above, and for example, polyfunctional (meth)acrylates and the like may also be used.

The energy ray-polymerizable monomer is used in a proportion of preferably 10 to 500 parts by mass, more preferably 30 to 200 parts by mass, and especially preferably 50 to 180 parts by mass based on 100 parts by mass of the urethane acrylate oligomer. By allowing the blending amount of the energy ray-polymerizable monomer to fall within the foregoing range, it is easy to regulate the peak temperature of tan δ to 60° C. or lower while making the film forming properties of the buffer layer favorable.

The energy ray-polymerizable monomer may be used either solely or in combination of two or more thereof. For example, it is preferred to blend the aforementioned resin composition with a (meth)acrylate having an aromatic structure. In addition, the (meth)acrylate having an aromatic structure may be used in combination with other energy ray-polymerizable monomer. For example, as the other energy ray-polymerizable monomer that is used together with the (meth)acrylate having an aromatic structure, a (meth)acrylate having an alicyclic structure may be used. In that case, the (meth)acrylate having an aromatic structure is blended in a proportion of preferably 0.1 to 2.0, more preferably 0.2 to 1.5, and especially preferably 0.3 to 0.8 in terms of a mass ratio to the (meth)acrylate having an alicyclic structure.

In this way, when the (meth)acrylate having an aromatic structure is used, it is easy to regulate the peak temperature of tan δ to a low temperature while making the elastic modulus of the buffer layer to an appropriate value.

As the (meth)acrylate having an aromatic structure, a (meth)acrylate having an aryl group, such as a phenyl group, etc., and a hydroxyl group, as exemplified by phenylhydroxypropyl (meth)acrylate and the like, is preferably used.

In addition, as the (meth)acrylate having an alicyclic structure, a (meth)acrylate having a polycyclic alicyclic structure is preferred, and as suitable examples thereof, among those exemplified above, isobornyl (meth)acrylate and dicyclopentanyl (meth)acrylate are exemplified.

In addition, the energy ray-polymerizable monomer may be composed of only a (meth)acrylate having a polycyclic alicyclic structure.

In the case of forming the urethane-containing cured material of the present invention from an energy ray-curable type resin composition, a photopolymerization initiator may be blended in the composition. By blending the photopolymerization initiator, a time for polymerization and curing by photoirradiation and a photoirradiation dose can be reduced.

Examples of the photopolymerization initiator include photoinitiators, such as a benzoic compound, an acetophenone compound, an acylphosphine oxide compound, a titanocene compound, a thioxanthone compound, a peroxide compound, etc.; photosensitizers, such as an amine, a quinone, etc.; and the like. Specifically, there can be exemplified 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, β-chloroanthraquinone, 2-hydroxy-2-methyl-1-phenyl-propan-1-one, and the like.

A use amount of the photopolymerization initiator is preferably 0.05 to 15 parts by mass, more preferably 0.1 to 10 parts by mass, and especially preferably 0.3 to 7 parts by mass based on 100 parts by mass of a sum total of the urethane acrylate oligomer and the energy ray-polymerizable monomer.

It is possible to properly vary the peak temperature of tan δ of the buffer layer by the kind or molecular weight of the urethane acrylate oligomer as well as the blending amount or kind of the energy ray-polymerizable monomer.

For example, in the case of selecting a polyether-based compound as the urethane acrylate oligomer, it is easy to regulate the peak temperature of tan δ to a low temperature as compared with the case of selecting a polyester-based compound. In addition, by making the molecular weight of the urethane acrylate oligomer large, a crosslinking density of the urethane-containing cured material is made small, thereby making it easy to regulate the peak temperature of tan δ to a low temperature.

In addition, by making a mass proportion of the energy ray-polymerizable monomer to the urethane acrylate oligomer high, it is easy to regulate the peak temperature of tan δ of the buffer layer to a low temperature. In addition, by making a content proportion of the (meth)acrylate having an alicyclic structure in the whole energy ray-polymerizable monomer small, it is easy to make the peak temperature of tan δ of the buffer layer to a low temperature.

In the present invention, by properly adjusting the blending amount, kind, and molecular weight of each of the components in the above manners, the value of tan δ can be regulated to 60° C. or lower.

The buffer layer of the present invention can be formed by coating the aforementioned resin composition on the substrate film and curing it. In the case of the energy ray-curable type resin composition, curing of the resin composition can be performed upon irradiation with energy rays, such as ultraviolet rays, etc. In addition, though coating of the resin composition is not particularly restricted, the resin composition may be coated after being diluted with a known diluent, or without being diluted with a diluent, and it may be coated by casting or extrusion.

[Pressure Sensitive Adhesive Layer]

A pressure sensitive adhesive for forming the pressure sensitive adhesive layer is not particularly restricted, and a variety of pressure sensitive adhesives which have hitherto been used for a back grind tape can be used. Specifically, rubber-based pressure sensitive adhesives, acrylic-based pressure sensitive adhesives, silicone-based pressure sensitive adhesives, polyvinyl ether-based pressure sensitive adhesives, and the like are used. In addition, energy ray-curable type, heat foaming type, and water-swellable type pressure sensitive adhesives can be used. Energy ray-curable type pressure sensitive adhesives that are cured with energy rays, such as ultraviolet rays, etc., are preferably used.

A thickness of the pressure sensitive adhesive layer is properly determined depending upon conditions, such as a shape and a surface state of the wafer to be protected, a polishing method, etc., and it is preferably 5 to 500 µm, and more preferably 10 to 300 µm.

The pressure sensitive adhesive layer may be protected by a release film in such a manner that the release film is further stuck thereonto. The release film is not particularly restricted, those prepared by subjecting a sheet, such as a film, a paper, etc., to a release treatment with a release agent can be used.

[Use Method of Back Grind Tape]

The back grind tape according to the present invention is preferably stuck onto a semiconductor wafer to be divided into chips by a dicing before grinding method and it is used for, for example, protection of the wafer front face and temporary fixing means of the wafer. The dicing before grinding method is a production method of semiconductor chips in which a groove shallower than the wafer thickness is formed on the front face of a wafer having a semiconductor circuit formed thereon, a back face of the semiconductor wafer is then ground to make the wafer thickness thin, and the wafer is divided into individual chips. However, the back grind tape of the present invention is not limited to the dicing before grinding method, and it can be used for a method in which the back grind tape is stuck onto the wafer front face in grinding the wafer back face.

In the case where the back grind tape according to the present invention is used for the dicing before grinding method, more specifically, it is used for a production method of semiconductor chips including the following steps.

First step: A step of forming grooves having a predetermined depth on the wafer front face by dicing processing along cutting positions of a wafer for partitioning plural circuits.

Second step: A step of allowing the back grind tape of the present invention to adhere onto the wafer front face through a pressure sensitive adhesive layer so as to cover the wafer front face on which circuits are to be formed entirely.

Third step: A step of disposing the wafer having the back grind tape adhered thereonto on a porous table such that the buffer layer side comes into contact with the porous table.

Fourth step: A step of grinding the back face side of the wafer in a state where the wafer disposed on the porous table is fixed by a negative pressure, thereby dividing individual chips.

Fifth step: A step of picking up the divided individual chips.

In the aforementioned fifth step, in general, a pickup sheet is stuck onto a ground face (back face) of the chips, the chip position and direction are adjusted so as to enable pickup, and the pickup sheet is fixed to a ring frame. Subsequently, the back grind tape is released, and each chip is then picked up. Here, in the case where the pressure sensitive adhesive layer is formed of a curing type pressure sensitive adhesive layer, such as an energy ray-curable type pressure sensitive adhesive, etc., it is preferred that the pressure sensitive layer is cured upon irradiation with energy rays, or the other, thereby reducing an adhesive strength prior to releasing the back grind tape, typically prior to sticking the pickup sheet.

In the light of the above, in the present invention, it is possible to inhibit the generation of a fine breakage in a wafer edge part at the time of wafer grinding while making the rigidity of a film substrate high. In addition, in the present invention, in view of the fact that the rigidity of the film substrate is high, in the case of being used for dicing before grinding, the alignment of chips after singulation of the wafer can be made favorable.

EXAMPLES

The present invention is hereunder described in more detail on a basis of Examples, but it should be construed that the present invention is by no means restricted to these Examples.

Evaluation methods and measurement methods of respective physical properties in the present invention are as follows.

(1) Young's Modulus

A substrate film was subjected to a tensile test using a tensile tester, and a Young's modulus was calculated from a chart of the resulting tensile strength and elongation. A sample film was cut out in a size of 15 mm in width and 150 mm in length and set in a tensile tester (Tensilon, manufactured by Orientec Corporation) such that a length of a portion to be stretched was 100 mm. On that occasion, a flow direction of the substrate film was made coincident with a tensile direction. Thereafter, the measurement was performed at a test speed of 200 mm/min and a chart speed of 1,000 mm/min. The Young's modulus was calculated from an inclination at the starting point of the resulting measured value.

(2) tan δ

A tensile stress at 11 Hz was measured with a dynamic viscoelasticity instrument. Specifically, a buffer layer of each of the Examples and Comparative Examples was laminated to prepare a laminate having a thickness of 200 µm, which was then cut into a size of 5×15 mm to obtain a sample for measurement. This sample was subjected to temperature rise at a temperature rise rate of 3° C./min from an initial temperature of −10° C. to 150° C.; a tan δ was measured at a frequency of 11 Hz by a dynamic viscosity measuring instrument [model name: DMA Q800, manufactured by TA Instruments]; and a temperature at which the tan δ showed a maximum value was read.

(3) Weight Average Molecular Weight

A weight average molecular weight Mw as converted into standard polystyrene was measured by the gel permeation chromatography (GPC) method.

A urethane acrylate oligomer was measured under the following conditions.

Measuring instrument: "HLC-8220GPC", manufactured by Tosoh Corporation

Column; "TSK Gel G1000H" and "TSK Gel G2000H", manufactured by Tosoh Corporation Developing solvent: Tetrahydrofuran
Liquid sending speed: 0.35 mL/min
Column temperature: 40° C.
Detector: Differential refractive index meter In addition, an acrylic copolymer used for a pressure sensitive adhesive layer was measured under the following conditions.

Measuring instrument: "HLC-8120GPC", manufactured by Tosoh Corporation

Column; "TSK guard column $H_{XL}$-H", two of "TSK Gel GMH$_{XL}$", and "TSK Gel G2000H$_{XL}$", manufactured by Tosoh Corporation Developing solvent: Tetrahydrofuran
Liquid sending speed: 1.0 mL/min
Column temperature: 40° C.
Detector: Differential refractive index meter (4) Evaluation of Edge Breakage A semiconductor wafer (8 inches) was subjected to dicing before grinding using DFD6361, manufactured by DISCO Corporation. Specifically, grooves were formed on the wafer front face from the circuit face side such that a size of the finally obtained chips was 1 mm×1 mm. Using RAD-3510F/12, manufactured by Lintec Corporation, a back grind tape from which a release film had been peeled off was stuck onto the wafer front face having grooves formed thereon, and the back face of the wafer was ground (dry polished) to an extent of 30 μm in thickness by using a grinder (DGP8760, manufactured by DISCO Corporation). Thereafter, an edge portion of the ground wafer was observed by a digital microscope, and the number of edge breakages was counted. It is to be noted that only those having a size of 10 μm or more were counted as breakages. The case where the number of edge breakages was 50 or less was evaluated as "A", and the case where the number of edge breakages was more than 50 was evaluated as "B".

Example 1

[Preparation of Substrate for Back Grind Tape]

A resin composition for buffer layer composed of a mixture of 40 parts by mass of a polyester-based urethane acrylate oligomer (weight average molecular weight: 10,000), 20 parts by mass of phenylhydroxypropyl acrylate, 40 parts by mass of isobornyl acrylate, and 0.5 parts by mass of a photopolymerization initiator (IRGACURE 1173, manufactured by BASF SE) was prepared. This resin composition for buffer layer was coated on a substrate film of polyethylene terephthalate (thickness 50 μm, Young's modulus: 2,500 MPa) in a thickness after curing of 50 μm and cured upon irradiation with ultraviolet rays (230 mW/cm$^2$, 500 mJ/cm$^2$), thereby obtaining a substrate for back grind tape in which a buffer layer of a urethane-containing cured material was formed on one face of the substrate film.

[Preparation of Back Grind Tape]

Firstly, a pressure sensitive adhesive composition containing 100 parts by mass of an energy ray-curable type acrylic copolymer, which was obtained by allowing an acrylic copolymer (weight average molecular weight: 500,000) constituted by, as monomers, 52 mass % of butyl acrylate, 20 mass % of methyl methacrylate, and 28 mass % of 2-hydroxyethyl acrylate to react with 2-methacryloyloxy-ethyl isocyanate (MOI) (80 equivalents to 100 equivalents of a hydroxyl group that is a functional group of the acrylic copolymer), and 0.5 parts by mass of a trimethylolpropane tolylene diisocyanate adduct as a crosslinking agent, and diluted with toluene in a concentration of 30 mass %, was prepared. Subsequently, this pressure sensitive adhesive composition was coated on a release film (SP-PET381031, manufactured by Lintec Corporation) in a thickness after drying of 20 μm and dried at 100° C. for one minute to form a pressure sensitive adhesive layer. Thereafter, the pressure sensitive adhesive layer was stuck to the substrate film side of the substrate for back grind tape, thereby obtaining a back grind tape having the release film thereon.

Example 2

The same procedures as in Example 1 were followed, except for using a mixture of 55 parts by mass of a polyether-based urethane acrylate oligomer (weight average molecular weight: 5,500), 45 parts by mass of dicyclopentanyl acrylate, and 5 parts by mass of a photopolymerization initiator (IRGACURE 2959, manufactured by BASF SE) as the resin composition for buffer layer.

Comparative Example 1

The same procedures as in Example 1 were followed, except for using a mixture of 50 parts by mass of a polycarbonate-based urethane acrylate (weight average molecular weight: 4,100), 50 parts by mass of dicyclopentanyl acrylate, and 1 part by mass of a photopolymerization initiator (IRGACURE TPO, manufactured by BASF SE) as the resin composition for buffer layer.

Comparative Example 2

The same procedures as in Example 1 were followed, except for not providing the buffer layer.

The measurement results of the peak temperature and peak value of tan δ and the test results of the evaluation of edge breakage of each of the Examples and Comparative Examples are shown in Table 1.

TABLE 1

| | tan δ | | Edge breakage | |
|---|---|---|---|---|
| | Peak temperature (° C.) | Peak value | Number of breakages | Evaluation |
| Example 1 | 40.6 | 0.90 | 29 | A |
| Example 2 | 56.7 | 0.89 | 48 | A |
| Comparative Example 1 | 86.5 | 1.2 | 60 | B |
| Comparative Example 2 | — | — | 187 | B |

In the light of the above, in each of the Examples, nevertheless a film with high rigidity was used for the substrate film, by regulating the peak temperature of tan δ to 60° C. or lower, the breakage of the wafer edge at the time of grinding could be reduced. On the other hand, in Comparative Example 1 in which the peak temperature of tan δ was higher than 60° C. and Comparative Example 2 in which the buffer layer was not provided, the breakage of the wafer edge at the time of grinding could not be thoroughly prevented.

The invention claimed is:

1. A back grind tape, comprising:
    a substrate, comprising:
        a substrate film having a Young's modulus of 600 MPa or more; and
        a buffer layer on one face of the substrate film; and
    a pressure sensitive adhesive layer on a face of the substrate film opposite to the face on which the buffer layer is provided,
    wherein the buffer layer is formed of a urethane-comprising cured material, which is a cured product of a resin composition comprising a urethane acrylate oligomer and an energy ray-polymerizable monomer comprising a (meth)acrylate having an aromatic structure and a (meth)acrylate having an alicyclic structure,
    wherein the urethane acrylate oligomer has a weight average molecular weight in a range from 2,000 to 30,000,
    wherein the energy ray-polymerizable monomer is employed in a proportion of 50 to 200 parts by mass, based on 100 parts by mass of the urethane acrylate oligomer,
    wherein a thickness of the buffer layer is 5 to 100 μm, and
    wherein the buffer layer has a peak temperature of tan δ of 60° C. or lower; and a mass ratio of the (meth) acrylate having an aromatic structure to the (meth) acrylate having an alicyclic structure is from 0.3 to 0.8.

2. The back grind tape according to claim 1, wherein the (meth)acrylate having an aromatic structure is a (meth) acrylate having an aryl group and a hydroxyl group.

3. The back grind tape according to claim 2, wherein the (meth)acrylate having an alicyclic structure is a (meth) acrylate having a polycyclic alicyclic structure.

4. The back grind tape according to claim 1, wherein the peak temperature of tan δ is 45° C. or lower.

5. The back grind tape according to claim 1, wherein the peak value of tan δ is 0.7 or more.

6. The back grind tape according to claim 1, wherein the peak value of tan δ is 0.85 or more.

* * * * *